(12) United States Patent
Hartnett

(10) Patent No.: US 6,754,295 B1
(45) Date of Patent: Jun. 22, 2004

(54) METHOD AND APPARATUS FOR SYNCHRONIZING DATA TRANSMISSION AND RECEPTION OVER A NETWORK

(75) Inventor: Thomas Hartnett, Westford, MA (US)

(73) Assignee: Comrex Corporation, Devens, MA (US)

(*) Notice: Subject to any disclaimer, the term of this patent is extended or adjusted under 35 U.S.C. 154(b) by 0 days.

(21) Appl. No.: 09/545,375

(22) Filed: Apr. 7, 2000

(51) Int. Cl.[7] .............................................. H04L 7/00
(52) U.S. Cl. ...................................... 375/356; 375/355
(58) Field of Search ................................ 375/222, 376, 375/355, 356; 380/274; 379/399.01, 352; 370/352

(56) References Cited

U.S. PATENT DOCUMENTS

| | | | |
|---|---|---|---|
| 3,754,098 A | 8/1973 | Abramson et al. | 178/69.5 R |
| 4,803,726 A * | 2/1989 | Levine et al. | 380/274 |
| 5,208,831 A | 5/1993 | Ueno et al. | 375/7 |
| 5,278,865 A | 1/1994 | Amrany et al. | 375/8 |
| 5,432,513 A | 7/1995 | Okamoto | 341/108 |
| 5,450,452 A * | 9/1995 | Kakuishi et al. | 375/376 |
| 5,457,717 A | 10/1995 | Bellamy | 375/372 |
| 5,481,574 A | 1/1996 | Evert et al. | 375/356 |
| 5,706,335 A | 1/1998 | Hinderks | 379/93 |
| 5,781,600 A | 7/1998 | Reeve et al. | 375/376 |
| 5,790,538 A | 8/1998 | Sugar | 370/352 |
| 5,790,891 A | 8/1998 | Solt et al. | 395/854 |
| 5,828,696 A | 10/1998 | Gelblum et al. | 375/222 |
| 5,835,787 A | 11/1998 | Raffman et al. | 395/841 |
| 5,903,775 A | 5/1999 | Murray | 395/853 |
| 6,011,955 A | 1/2000 | Tsuchiyama | 455/38.4 |
| 6,041,295 A | 3/2000 | Hinderks | 704/206 |
| 6,332,119 B1 | 12/2001 | Hinderks | 704/206 |
| 6,339,756 B1 | 1/2002 | Hinderks | 704/201 |
| 6,442,271 B1 * | 8/2002 | Tuttle et al. | 379/399.01 |

FOREIGN PATENT DOCUMENTS

EP  0 718 995 A1  6/1996

OTHER PUBLICATIONS

Comrex Product Brochure, Comrex., Jul. 2000.
Eliminate ISDN Evils, Comrex brochure, Aug. 1999.
Nexus, ISDN CODEC, Comrex brochure, Oct. 1997.
Buddy Remote Mixer, Comrex brochure, Oct. 1997.
Hotline Pots CODEC, Comrex brochure, Oct. 1997.
"Comrex Vector Pots codec" by Steve Fluker, BE Radio, Mar. 1999.
Vector Pots CODEC, Comrex brochure, Jun. 1998.
Product Summary, Comrex Brochure, Jun. 2000.
Patent Cooperation Treaty, International Search Report, International Application No. PCT/US01/10500, mailed on Nov. 20, 2002, 7 pages.

* cited by examiner

Primary Examiner—Stephen Chin
Assistant Examiner—Curtis Odom
(74) Attorney, Agent, or Firm—Testa, Hurwitz & Thibeault, LLP

(57) ABSTRACT

In one embodiment, the invention is directed to methods and system for converting an analog signal to digital samples for transmission over a communication network, and for converting digital samples received over a communication network to an analog signal. According to one feature, the system of the invention generates encoding and decoding master clocks from local oscillators, thus enabling the system of the invention to operate in environments where reliable timing signal are not available from the communication network. According to another feature, the system of the invention adjusts the frequencies of the encoding and decoding master clocks based on a connect rate to the communication network. In a further feature, the system of the invention employs encoding and decoding buffers for buffering the digital samples between a modem or a digital network access device, and signal converters to maintain a defined time relationship between digital samples being transferred between the modem or the digital network access device and the signal converters.

26 Claims, 9 Drawing Sheets

METHOD AND APPARATUS FOR SYNCHRONIZING DATA TRANSMISSION AND RECEPTION OVER A NETWORK

FIELD OF THE INVENTION

The invention relates generally to communication systems. More specifically, the invention relates to synchronizing transmission and reception of data over a network independent of a network synchronizing timing signal.

BACKGROUND OF THE INVENTION

Typical communication networks, including telecommunication networks, include devices that require timing information to enable them to transmit and receive data at an appropriate times. For example, an audio coder-decoder (CODEC) is a device used in telecommunication systems for converting an uncompressed analog signal from for example, a microphone, to a compressed digital signal for transmission over a communication network. CODECs also enable reception of compressed digital signals by converting the compressed digital signals back to an analog signal and outputting the analog signal, to for example, a speaker. Video and multimedia CODECs perform similar functions over multimedia networks.

Traditionally, CODECs transmit data over communication networks in such a way as to maintain a defined relationship in time between the transmitted digital signals. Similarly, CODECs also receive data in such a way to maintain a defined relationship in time between the received digital signals while processing those signals.

In one example of the operation of an audio CODEC, a microphone provides an analog signal to an analog-to-digital (A/D) converter in the CODEC. A digital portion of the CODEC takes pulse code modulated (PCM) digital audio samples from the A/D converter, compresses those samples, and transmits them over the communication network. The digital portion of the CODEC also takes compressed PCM digital samples from the communication network, uncompresses those samples and feeds them to a digital-to-analog (D/A) converter.

Typically, the communication network is of a fixed, known bit-rate and provides a timing signal or clock at the bit-rate frequency which is used by the CODEC to maintain a defined time relationship between the transmitted samples and also between the received samples during processing. To avoid overflow and underflow of the transmitted data and thus distortion, traditional CODECs use the timing signal from the communication network to lock the rate at which the digital portion of the CODEC takes the PCM samples from the A/D converter with the rate at which the digital portion of the CODEC provides the compressed samples to the communication network. Similarly, the CODEC also uses the timing signal from the communication network to lock the rate at which the digital portion of the CODEC receives samples from the communication network with the rate at which the digital portion of the CODEC delivers samples to the D/A converter.

Using a communication network timing signal to regulate time relationships between samples transmitted over the communication network and between samples received from the communication network enjoys widespread usage in the networking community where a reliable network timing signal is always available. However, reliable network timing signals may not always be available. Thus, in one aspect, the invention addresses the situation in which a reliable network timing signal is not readily available.

SUMMARY

The invention is generally directed to methods and systems for converting analog signals to digital samples for transmission over a communication network, and for converting digital samples received over a communication network to analog signals. According to a feature of the invention, such conversions may be performed independent of a reliable network synchronizing timing signal.

According to one embodiment, the invention provides a coder-decoder (CODEC). In one aspect, the CODEC includes an analog-to-digital converter, a digital-to-analog converter, an encoding local oscillator, a decoding local oscillator, an encoding master clock generator, a decoding master clock generator, a modem or a digital network access device, and a controller. The modem enables the CODEC to connect to an analog communication network. Alternatively, a digital network access device could be used to enable the CODEC to connect to a digital communication network. The digital-to-analog converter converts digital samples received over the communication network by way of the modem to an analog signal. The analog-to-digital converter converts an analog signal to digital samples for transmission over the communication network by way of the modem.

According to one feature, the encoding master clock generator generates an encoding master clock signal from the encoding local oscillator, and a decoding master clock generator generates a decoding master clock signal from the decoding local oscillator. In one embodiment, the encoding master clock signal controls the sampling rate for the analog-to-digital converter, and the decoding master clock signal controls the conversion rate for the digital-to-analog converter. According to a further feature, the frequencies of the decoding and encoding master clock signals are at least in part dependent on a connect rate between the modem and the communication network.

According to one embodiment, the encoding master clock generator frequency divides a clock signal from the encoding local oscillator to obtain a phase comparator reference signal. The encoding master clock generator determines an initial divide ratio for performing the frequency divide based at least in part on a connect rate between the modem and the communication network. The encoding master clock generator then phase locks the comparator reference signal to generate the encoding master clock signal with a substantially constant initial frequency. According to another feature, the controller provides encoding buffer information to the encoding master clock generator, and the encoding master clock generator adjusts the encoding master clock frequency in dependence on the encoding buffer information from the controller.

According to another embodiment, the decoding master clock generator frequency divides a clock signal from the decoding local oscillator to obtain a phase comparator reference signal. The decoding master clock generator determines an initial divide ratio for performing the frequency divide based at least in part on a connect rate between the modem and the communication network. The decoding master clock generator then phase locks the comparator reference signal to generate the decoding master clock signal with a substantially constant initial frequency. According to another feature, the controller provides decoding buffer information to the decoding master clock generator, and the decoding master clock generator adjusts the decoding master clock frequency in dependence on the decoding buffer information from the controller.

The controller controls, among other things, the transfer of digital samples between the analog-to-digital and digitalto-analog converters and the modem. According to one feature, the controller provides an encoding buffer and a decoding buffer. The encoding buffer intermediately stores digital samples being transferred from the analog-to-digital converter to the modem. The decoding buffer intermediately stores digital signals being transferred from the modem to the digital-to-analog converter. The buffers enable the controller to maintain a defined time relationship between each of the digital samples during transfer between the converters and the modem. In the case of an acoustic CODEC, maintaining such a defined relationship reduces distortion in audio signals being processed by the CODEC. According to another feature each buffer has an associated fill pointer and an associated empty pointer. The fill pointer points to a location in the buffer where the next digital sample is to be stored. The empty pointer points to the buffer location storing the next digital sample to be transferred. In one embodiment, the controller maintains the defined time relationship between digital samples by monitoring a distance between the fill and empty pointers.

In the case of the encoding buffer, in response to the controller detecting that the distance between the fill and empty pointers are less than a predefined closeness threshold, the controller decreases the sampling rate of the analog-to-digital converter. In response to detecting that the distance between the fill and empty pointers are greater than a predefined separation threshold, the controller increases the sampling rate of the analog-to-digital converter.

In the case of the decoding buffer, in response to the controller detecting that the distance between the fill and empty pointers are less than a predefined closeness threshold, the controller increases the conversion rate of the digital to analog converter. In response to the controller detecting that the distance between the fill and empty pointers is greater than a predefined separation threshold, the controller decreases the conversion rate of the digital-to-analog converter.

In another embodiment, the controller alters the sampling rate of the analog-to-digital converter by changing the frequency of the encoding master clock signal. Similarly, the controller alters the conversion rate of the digital-to-analog converter by changing the frequency of the decoding master clock signal.

According to another feature, the controller applies well known data compression algorithms to digital samples coming from the analog-to-digital converter, and well known data decompression algorithms to data coming from the modem or the digital network access device.

BRIEF DESCRIPTION OF THE DRAWINGS

The above and further advantages of the invention may be better understood by referring to the following description taken in conjunction with the accompanying drawings, in which.

DETAILED DESCRIPTION

Figure 1:
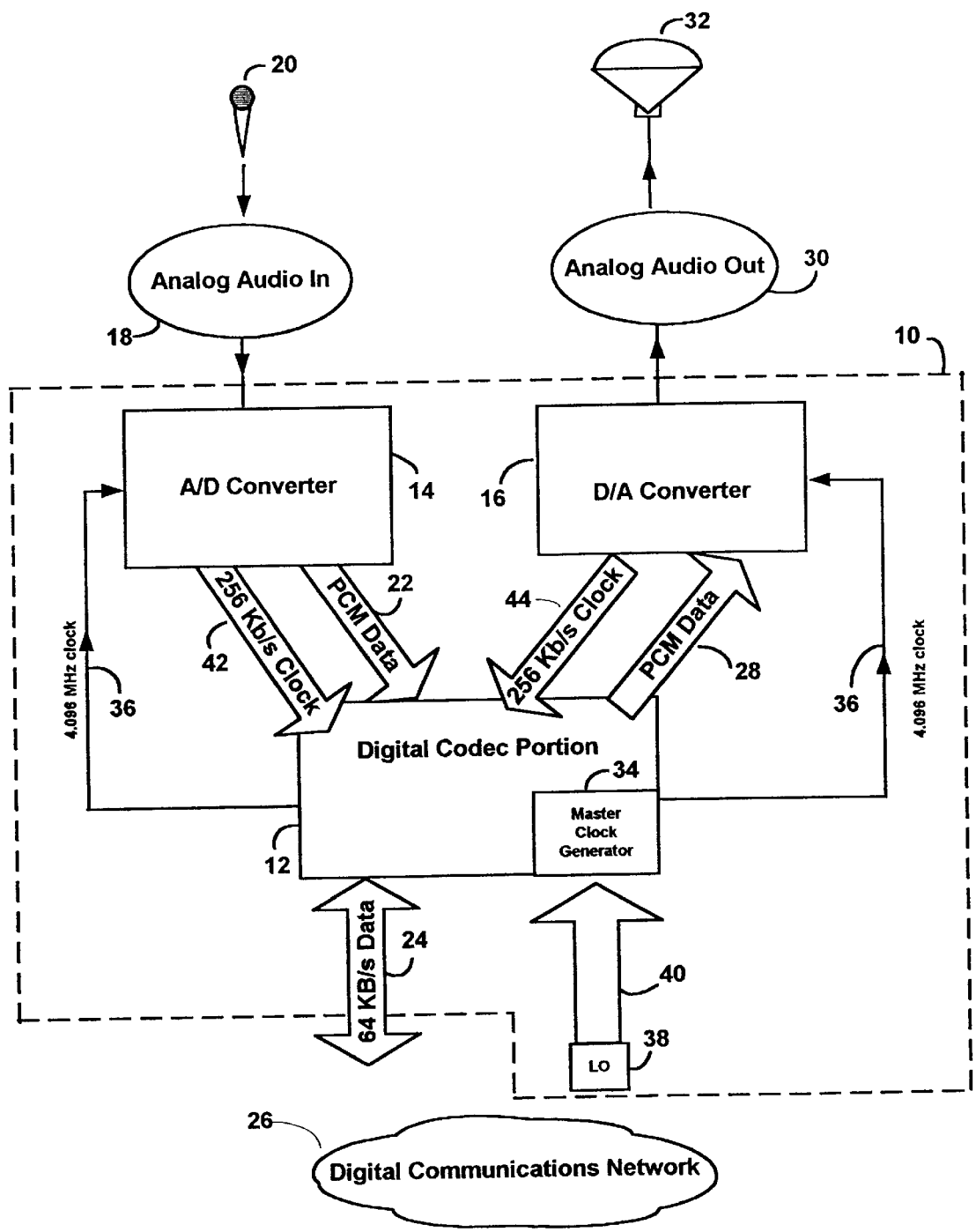
FIG. 1 is a block diagram of a network system employing a CODEC according to an illustrative embodiment of the invention.

FIG. 1 depicts an illustrative network communication system employing a coder-decoder (CODEC) 10 according to one embodiment of the invention. Illustratively, the CODEC 10 is shown being used in a telecommunication system. However, as skilled artisans will appreciate, the CODEC 10 may just as readily be employed in any multi-media application. Conceptually, the CODEC 10 includes a digital CODEC portion 12, an A/D converter 14 and a D/A converter 16. The A/D converter 14 converts an uncompressed analog signal 18 from for example, a microphone 20 to a series of PCM digital samples 22. The digital CODEC portion 12 compresses the PCM digital samples 22 into compressed digital samples 24 and transmits the compressed digital samples 24 over a communication network 26. For receiving compressed digital samples 24 from the communication network 26, the digital CODEC portion 12 converts the compressed digital samples 24 to an uncompressed series of PCM digital samples 28 and provides the PCM digital samples 28 to the D/A converter 16. The D/A converter 16 converts the PCM digital samples 28 into an analog signal 30, which can be output for example, to a speaker 32.

The digital CODEC portion 12 also includes a master clock generator 34, for generating a master clock signal 36 (illustratively, 4.096 MHz) relating to the connect rate between the digital CODEC portion 12 and the communication network 26. The master clock generator 34, in one embodiment, interfaces with a local oscillator 38, which provides a substantially constant timing signal 40. The A/D converter 14 uses the master clock signal 36 to generate the sample rate clock 42 for the digital CODEC portion 12. Similarly, the D/A converter 16 uses the master clock signal 36 to generate the sample rate clock 44 for the digital CODEC portion 12. In the illustrative embodiment, the A/D converter 14 is a CS5330 and the D/A converter 16 is a CS4330, both available from Crystal Semiconductor, located in San Jose, Calif. A feature of these parts is that they generate the serial clocks 42 and 44. However, in alternate embodiments A/D and D/A converters without this feature may be employed. In those embodiments, the digital CODEC portion 12 generates the serial clocks 42 and 44 and provides them to the A/D and D/A converters 14 and 16, respectively.

In illustrative operation, the connect rate for transferring the compressed digital samples 24 between the digital CODEC portion 12 and the communication network 26 is 64 KB/s, and the A/D converter 14 samples the audio input 18 at 16 KHz with 16-bit quantization. This means that the digital CODEC portion 12 serially transfers the PCM digital samples 22 at a rate of 256 KB/s (16,000 Hz sample rate×16-bit quantization) from the A/D converter 14. Thus, the A/D converter 14 provides the digital CODEC portion 12 with a 256 KB/s serial clock 42. Typically, audio A/D and D/A converters require a master clock that has a frequency that is 256 times that of the sampling frequency. Therefore the digital CODEC portion 12 provides the A/D converter 14 with the master clock 36 at a frequency of 4.096 MHz. Since there is a 4:1 ratio between the serial clock 42 and the connect rate between the digital CODEC portion 12 and the communication network 26, the illustrative digital CODEC portion 12 also provides a 4:1 data compression ratio. Similarly, the D/A converter 16 also operates with 16 KHz sampling and 16-bit quantization. Thus, the digital CODEC portion 12 provides the 4.096 MHz master clock 36 to the D/A converter 16. In return, the D/A converter 16 provides the digital CODEC portion 12 with a 256 KB/s serial clock 44.

Although the illustrative embodiment of FIG. 1 depicts a connect rate of 64 KB/s, A/D and D/A sampling/conversion rates of 16 KHz with 16-bit quantization, and a master clock 36 of 4.096 MHz, other sampling/conversion rates, quantizations and master clock frequencies may be employed. By way of example, the frequency of the master clock 36 may be increased to 8.192 MHz to accommodate for example, a 32 KHz sampling rate. Additionally, the connect rates between the communication network 26 may vary for example, between about 9.6 KB/s and about 64 KB/s, or for example, between about 9.6 KB/s and about 33.6 KB/s.

As mentioned above, the illustrative CODEC 10 of FIG. 1 may be employed in audio, video and/or any multimedia applications. As skilled artisans will appreciate, the illustrative CODEC 10 may also be used in asynchronous network applications, such as in voice over internet protocol, or in encryption applications.

Figure 2:
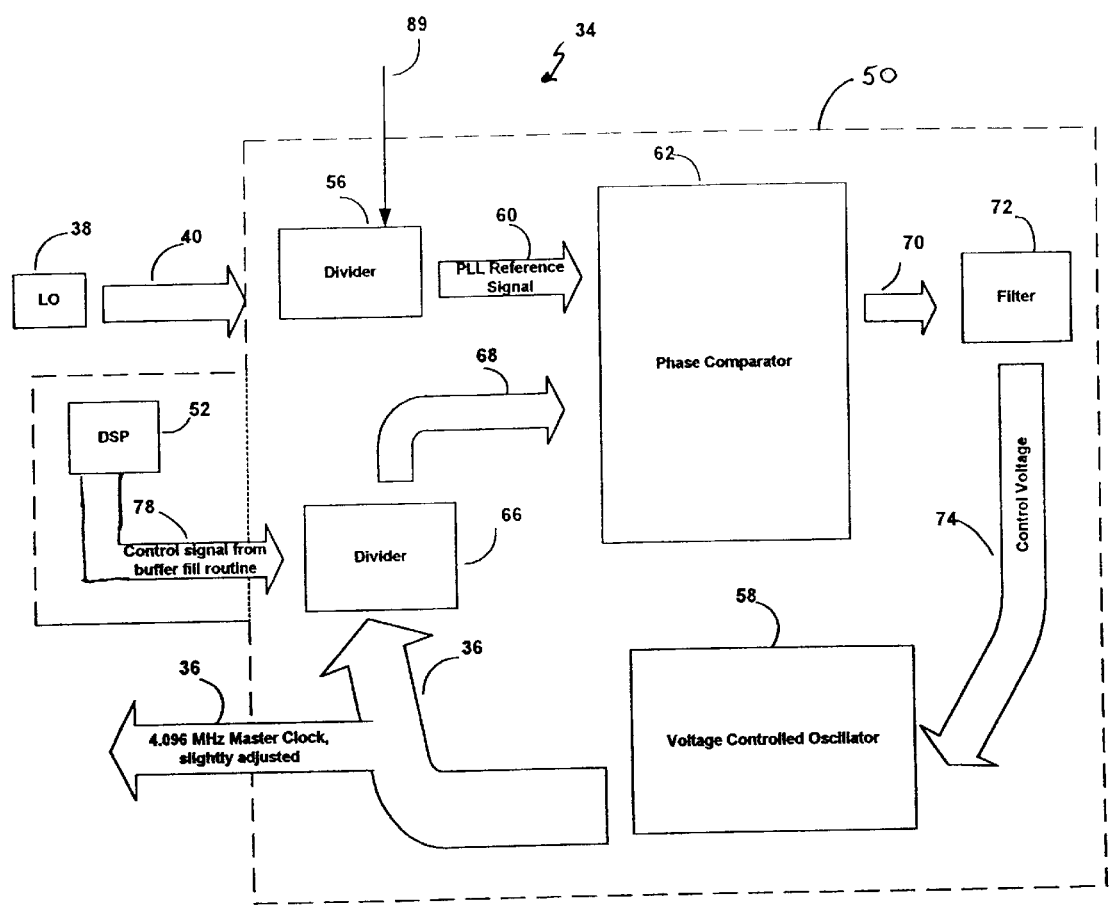
FIG. 2 is a block diagram of an exemplary phase-locked-loop (PLL) timing circuit employed in the illustrative CODEC of FIG. 1.

FIG. 2 depicts a more detailed block diagram of an illustrative embodiment of the master clock generator 34 of FIG. 1. As depicted, the illustrative master clock generator 34 includes a phase locked loop (PLL) portion 50 and a digital signal processor (DSP) portion 52. A local oscillator 38, generates a clock signal 40. The PLL 50 couples the clock signal 40 to the divider 56. The divider 56 reduces the frequency of the local oscillator clock signal 40 so that it is comparable to the frequency of the clock signal 68 from the voltage controlled oscillator (VCO) 58, after the VCO output 36 is divided by the divider 66. The reduced local oscillator timing signal 60 from the divider 56 provides a reference signal for the phase comparator 62. The output signal 36 of the VCO 58 couples to the divider 66. The divider 66 has a fixed divide ratio that it applies to the signal 36 of the VCO 58. However, this ratio may be changed by the DSP 52, which provides the control signal 78 from the buffer fill routine (discussed below with respect to FIG. 4). The phase comparator 62 phase compares the compensated feedback clock signal 68 of the divider 66 with the phase comparator reference signal 60 and generates an error signal 70. The phase comparator 62 couples the error signal 70 to the filter 72, which filters the error signal 70. The filter 72 then couples the filtered error signal 74 to the VCO 58. The VCO 58 uses the filtered error signal 74 to adjust the VCO output 36. The control signal 78 provides an adjustment to the divide ratio of the divider 66 to compensate for drift in the local oscillator 38. As discussed in further detail below with respect to FIG. 3, the signal 89 from a control processor 88 provides an initial divide ratio for the divider 56.

According to the illustrative embodiment, the selection of the proper divide ratio for the divider 66 is constrained by a plurality of factors. These factors may include:

1. The divide ratio (and the frequency of the reference clock signal 36) should be chosen such that a common output frequency is available from the VCO divider 66, and from the local oscillator 38 after division by the divider 56.
2. The divide ratio should be large enough so that a change in ratio of ±1 is larger than the maximum possible error between the network timing and the local oscillator 38. Typical commercial grade oscillators have error parameters of approximately 100 ppm. Given that both the network 26 and the local oscillator 38 may have errors in opposite directions, a minimum value "adjustment step size" of the divider 66 is chosen so that the change in output frequency when an adjustment is made is at least 200 ppm. In practice, a step size of at least 400 ppm will provide an error "guard band" while maintaining the requirements of the following parameter.
3. The divide ratio should be kept large enough (and the "adjustment step size" small enough) so that adjustments are made as seldom as possible. If multiple adjustments are made in a short amount of time, audio distortion will result. In practice, the divide ratio and DSP buffer size (discussed below with respect to FIG. 5) should be balanced so that any two adjustments are at least several seconds apart.
4. The divide ratio of the VCO divider 66 should be kept as small as possible to prevent excessive "jitter" in the PLL 34. If the divide ratio is too large, (and the frequency of the clock 60 is too small), the phase comparator output 70 will be unable to make adequate adjustments to the VCO to keep the PLL 34 "in lock."

Figure 3:
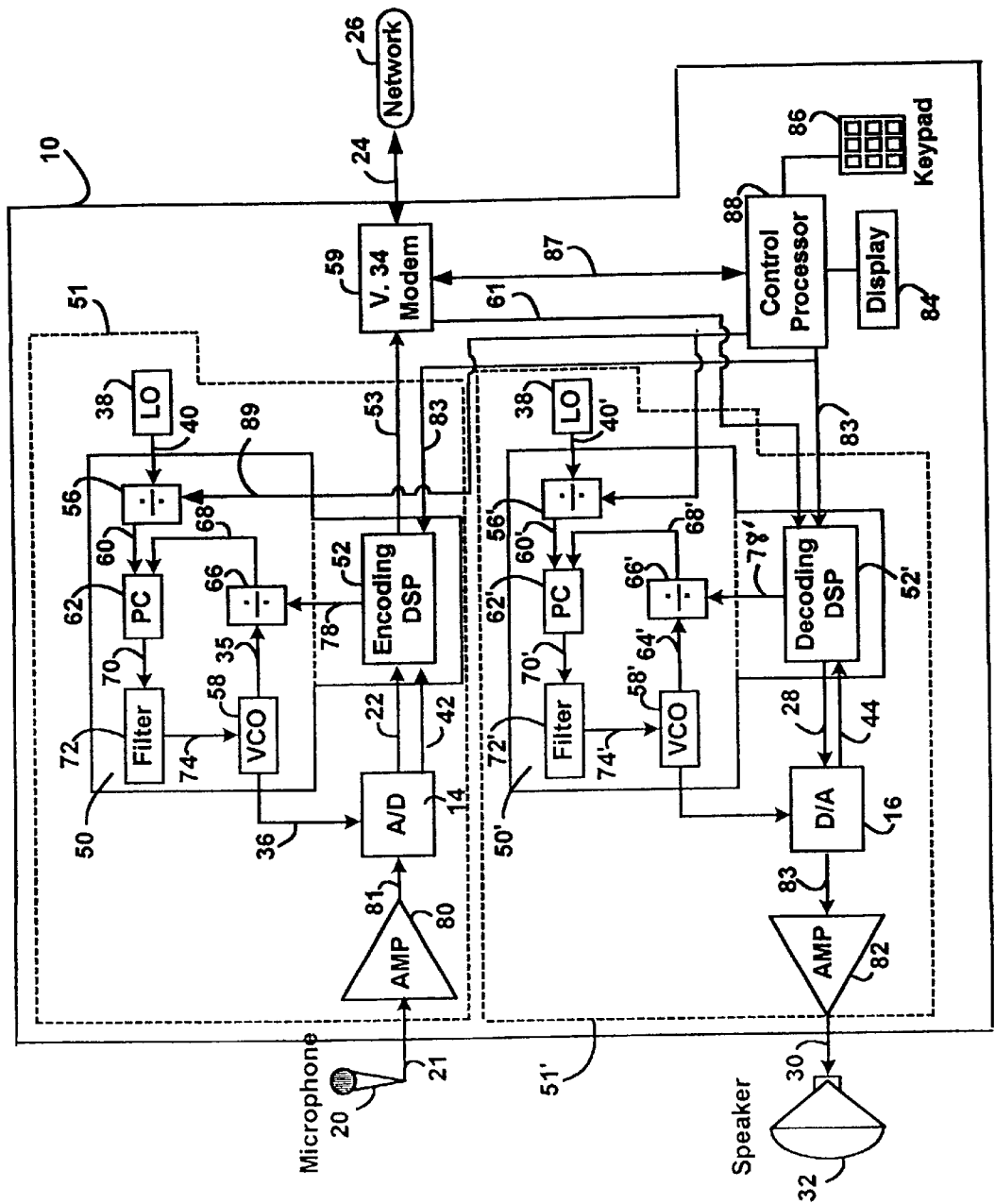
FIG. 3 is a more detailed block diagram of the illustrative CODEC of FIG. 1.

FIG. 3 is a more detailed block diagram of the illustrative CODEC 10 of FIG. 1. The CODEC 10 includes an encoding section 51 and a decoding section 51'. The encoding section 51 includes an encoding DSP 52, which controls the encoding section 51; and an encoding PLL circuit 50, which generates a master clock signal 36 based on an encoding PLL reference signal 40 from a local oscillator 38. The encoding section 51 also includes an A/D converter 14 and an amplifier/filter 80. A microphone 20 couples audio signals to the amplifier/filter 80. The amplifier/filter 80 amplifies and filters the audio signal 21 from the microphone 20 in a known manner, and couples the amplified and filtered signal 81 to the A/D converter 14. The A/D converter 14 converts the signal 81 into a series of uncompressed PCM digital samples 22, in synchronism with the master clock signal 36 supplied by the encoding PLL circuit 50. The A/D converter 14 then couples the PCM digital samples 22 to the encoding DSP 52. The encoding DSP 52 converts the uncompressed PCM digital samples 22 into compressed serial data. In one embodiment of the CODEC 10, the encoding DSP 52 compresses each 16-bit PCM digital sample of the series of PCM digital samples 22 into a 4-bit digital portion. Thus, the encoding DSP 52 illustratively provides a 4:1 compression ratio. The encoding DSP 52 then couples a series 53 of the 4-bit portions to a V.34 modem 59. The V.34 modem 59 then transmits the 4-bit portions in synchronism with the encoding master clock signal 36, over the network 26. In an alternative embodiment, a digital network access device is used in place of modem 59.

Turning to the PLL circuit 50 and as discussed above with respect to FIG. 2, the divider 56 provides a reference signal 60 to the phase comparator 62. The reference signal 60 serves as a time reference for the phase comparator 62 and ultimately for the sampling rate at the A/D converter 14. The A/D converter 14 uses the VCO master clock signal 36 for controlling the sampling frequency, and for generating the serial clock 42, which controls the transfer of the PCM digital data 22 from the A/D converter 14 to the encoding DSP 52. Preferably, the master clock signal 36 is set at a frequency several times that of the phase comparator reference signal 60, and is preferably in the range of about 2.048 MHz to about 8.192 MHz.

The decoding section 51' includes a decoding DSP 52', which controls the decoding section 51'; and a decoding PLL circuit 50', which generates a master clock signal 36' based on a decoding PLL reference signal 40' from a local oscillator 38'. The decoding section 51' also includes a D/A converter 16 and an amplifier/filter 82.

Operationally, the V.34 modem 59 receives compressed digital samples from the network 26. The V.34 modem 59 then transfers the compressed digital samples 61 to the decoding DSP 52'. The decoding DSP 52' uncompresses the compressed digital samples 62, by way of a 1:4 ratio, into a series of uncompressed 16-bit PCM digital samples 28. The DSP 52' then transfers the PCM digital samples 28 to the D/A converter 16. The D/A converter 16 converts the PCM digital samples 28, in synchronism with the master clock signal 36' supplied by the decoding PLL circuit 50', into an analog audio signal 83. The D/A converter 16 then passes the analog audio signal 83 to an amplifier/filter 82. The amplifier/filter 82 amplifies and filters the audio signal 83 in a known manner and couples the filtered and amplified audio signal 30 to a speaker 32.

Turning to the decoding PLL circuit 50', the devices having "primed" reference designations operate in essentially the same fashion as their "unprimed" counterparts. More specifically, the divider 56' provides a reference signal 60' to the phase comparator 62'. The reference signal 60' serves as a time reference for the phase comparator 62' and ultimately for the conversion rate of the D/A converter 16. The D/A converter 16 uses master clock signal 36' for controlling the conversion frequency and for generating the serial clock 44, which controls the transfer of the PCM digital data 28 from the decoding DSP 52' to the D/A converter 14. As in the case of the master clock signal 36, the master clock signal 36' is set at a frequency several times that of the phase comparator reference signal 60, and is preferably in the range of about 2.048 MHz to about 8.192 MHz.

The illustrative CODEC 10 also includes a control processor 88, a display 84 and a keypad 86. The control processor 88 interfaces to the modem 59 by way of the connection 87. The control processor 88 reads from the modem 59 the rate at which the modem 59 connects to the network 26. The control processor 88 also provides the modem 59 with standard initialization information, such as the telephone number to be dialed and the like. The display 84 in combination with the keypad 86 provides a user interface to the illustrative CODEC 10.

As discussed in further detail below, once the control processor 88 determines the rate at which the modem 59 connects to the network 26, the control processor 88 communicates this connect rate to the divider 56 and to the divider 56' by way of the connection 89. The divider 56 uses the connect information to adjust an initial setting of the phase comparator reference signal 60. Similarly, the divider 56' uses the connect information to adjust an initial setting of the phase comparator reference signal 60'.

The control processor 88 also supplies the connect rate information to the encoding DSP 52 and to the decoding DSP 52' by way of the connection 83. As discussed in further detail with respect to the DSP software control module 91 of FIG. 5, the encoding DSP 52 uses the connect rate information to set the default value for the divide ratio of the divider 66 by way of control signal 78. As also discussed with respect to the DSP software control module 91 of FIG. 5, the decoding DSP 52' uses the connect rate information to set the default value of the divide ratio of the divider 66' by way of the control signal 78'. According to the illustrative embodiment, the encoding section 51 and the decoding section 51' operate with independent timing. Therefore, the illustrative CODEC 10 includes a separate encoding PLL circuit 50 and decoding PLL circuit 50'. The illustrative CODEC 10 also provides for independent generation of the master clock signals 36 and 36'.

Figure 4A:
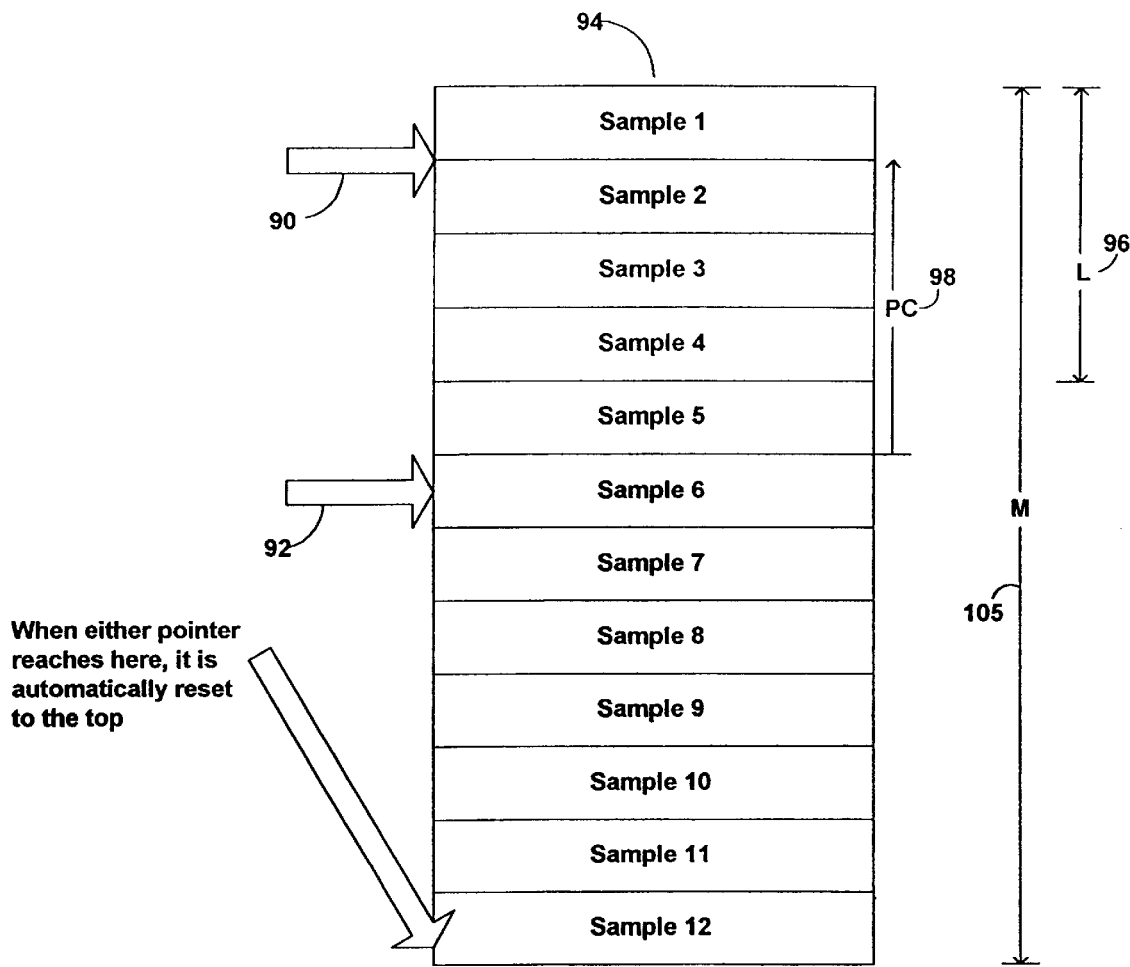
FIG. 4A depicts an exemplary circular buffer for maintaining defined timing relationships between digital PCM samples during encoding in the illustrative CODEC of FIG. 1.

FIG. 4A illustrates one embodiment of a fixed-size circular buffer 94 used to tie the data sampling rate of the A/D converter 14 or the data conversion rate of the D/A converter 16 to the asynchronous master clock signal 36 so that no overflow or underflow of the digital audio data 22 or 28 results. The buffer 94 temporarily stores pulse code modulated (PCM) audio signals that are either being transferred from the A/D converter 14 to the encoding DSP 52, or from the decoding DSP 52' to the D/A converter 16. The operation of the buffer 94 will be first described with respect to the encoding section 50 and then with respect to the decoding section 50' of the CODEC 10 of FIG. 3.

In operation of the encoding section 50, the encoder buffer 94 is created by the encoding DSP 52 based on connect rate information it receives from the control processor 88. The illustrative encoding section 50 encodes a fixed number L 96 of PCM samples at once, and in one embodiment the buffer length M 105 is chosen to be three times this fixed number of samples L 96. The modem 59 sends a connect request to the network 26. The modem 59 then interfaces with the network 26 at a specific connect rate. The control processor 88 relays the connect rate, via the connection 83, to the encoding DSP 52, which creates the buffer 94 in response to the modem connect rate. The encoding DSP 52 also creates the encoder fill pointer 90 and the encoder empty pointer 92. The encoder empty pointer 92 is driven by the rate at which the network 26 transmits data from the modem 59. The modem 59 requests data from the encoder routine 91a of FIG. 5, which in turn removes PCM samples from the location in the buffer 94 pointed to by the empty pointer 92 as the network 26 is able to transfer more data. Locations in the buffer 94 pointed to by the encoder fill pointer 90 receive data from the A/D converter 14 at the rate in which the A/D converter 14 samples the analog data from microphone 18. The A/D sampling rate is determined by the master clock signal 36. If compensation to the A/D sampling rate is not required, the master clock signal is effectively the phase comparator reference clock signal 60 derived from the local oscillator 38. However, if compensation to the A/D sampling rate is required, an adjustment to the divide ratio of the divider 66 will cause the sampling rate of the A/D converter 14 to be either increased or decreased. Since the phase comparator reference clock 60, derived from the local oscillator 38, is not correlated to the network data rate, the encoder fill pointer 90 and the encoder empty pointer 92 are free to move with respect to one another. After the analog data 18 is sampled by the A/D converter 14, it is stored in the buffer 94 at a location dictated by the position of the encoder fill pointer 90. A flag is then set in a software fill routine included in encoding DSP software 91a of FIG. 5 to indicate the location of the encoder fill pointer 90. Substantially simultaneously, data is being requested by the encoding DSP software 91a for compression and transmission by the modem 29. The location pointed to by the encoder empty pointer 92 contains data which is to be removed from the buffer 94 compressed and output by the modem 59. As data is removed, another flag indicating the location of the encoder empty pointer 92 is set in a software empty routine in the encoding DSP software 91a. The rate at which the encoder empty pointer 92 increments for removing data from the buffer 94 is directly correlated to the network connect rate. Whereas the rate at which the encoder fill pointer 90 increments for inputting data into the buffer 94 is directly correlated to the rate at which the A/D converter 14 provides data to the buffer 94.

As the encoder fill pointer 90 increments for inputting data to the buffer 94, the encoder empty pointer 92 increments at nearly the same rate for extracting data from the buffer 94. This allows the encoder fill pointer 90 and the encoder empty pointer 92 to drift in location with respect to one another. As the pointers 90 and 92 approach each other, an overflow condition can occur. This means that the encoder fill pointer 90 is incrementing faster than the empty pointer 92 and thus, data is being input to the buffer 94 faster than it is extracted. Since the buffer fill routine in the encoding DSP software 91a is monitoring the distance 98 between the pointers 90 and 92, it will send a signal 78 to the divider 66 to increase the divide ratio, which will have the effect of slowing down the master clock signal 36, which will decrease the sample rate of the A/D converter 14. As this happens, the pointers 90 and 92 will begin to separate. Once a nominal separation 98 exists between the pointers 90 and 92, the compensation signal 98 is removed.

If the pointers 90 and 92 separate too much from each other, an underflow condition can occur. This means that the encoder empty pointer 92 is increment faster than the encoder fill pointer 90 and thus, causing data to be removed from the buffer 94 faster than it is being added. Since the buffer fill routine in the software 91a is monitoring the distance 98 between the pointers 90 and 92, it will send a compensation signal 78 to the divider 66 to decrease the divide ratio, which will have the effect of speeding up the master clock signal 36 which will increase the sample rate the A/D converter 14. As this happens, the pointers 90 and 92 will begin to come together. Once a nominal separation 98 exists between the pointers 90 and 92, the compensation signal 78 is again removed.

Figure 4B:
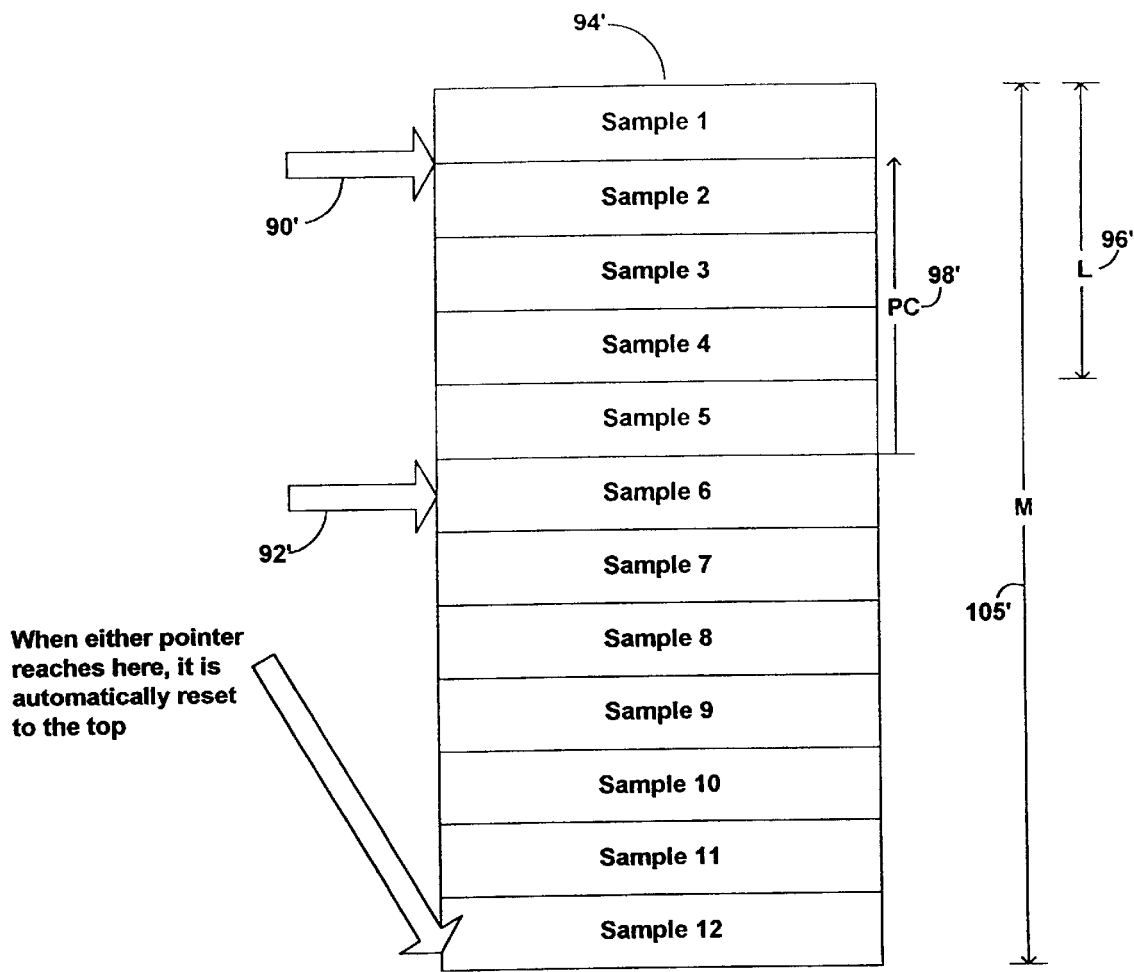
FIG. 4B is an exemplary circular buffer for maintaining defined timing relationships between digital PCM samples during decoding in the illustrative CODEC of FIG. 1.

Referring to FIG. 4B, in operation of the decoding section 50', the decoder buffer 94' is created by the decoding DSP 52' based on the connect rate information it receives from the control processor 88. The decoding section 50' decodes a fixed number L 96' of PCM samples at once, and in one embodiment the buffer length M 105' is chosen to be three times this fixed number of samples L 96'. The modem 59 receives a handshake signal from the network 26 requesting a connection. The modem 59 then interfaces with the network 26 at a specific connect rate. The control processor 88 relays the connect rate, via the connection 83, to the decoding DSP 52', which creates the buffer 94' in response to the modem connect rate. The decoding DSP 52' also creates the decoder fill pointer 90' and the decoder empty pointer 92'. The position of decoder fill pointer 90' is driven by the rate at which data is received from by the network 26. Locations in the buffer 94' pointed to by the decoder fill pointer 90' receive data from the decoding DSP software 91b, which decodes data from the modem 59 as the network 26 supplies it. Data is removed from locations in the buffer 94' pointed to by the decoder empty pointer 92' at the rate in which the D/A converter 16 converts the digital data to analog data. The D/A converting rate is determined by the master clock signal 36'. If compensation to the D/A converting rate is not required, the master clock signal 36' is effectively the phase comparator reference clock signal 60' derived from the local oscillator 38'. However, if compensation to the D/A converting rate is required, an adjustment to the divide ratio of the divider 66' will cause the converting rate of the D/A converter 16 to be either increased or decreased. Since the phase comparator reference clock signal 60' derived from the local oscillator 38', is not correlated to the network data rate, the decoder fill pointer 90' and the decoder empty pointer 92' are free to move with respect to one another. The data is outputted to the D/A converter 16 from locations in the buffer 94' pointed to by the decoder empty pointer 92'. A flag is then set in a software empty routine in the decoding DSP software 91b of FIG. 5 to indicate the location of the decoder empty pointer 92'. Substantially simultaneously, data is being stored in the buffer 94' at locations indicated by the fill pointer 90'. A flag is then set in the software fill routine in the decoding DSP software 91b to indicate the location of the decoder fill pointer 90'. The rate at which the decoder fill pointer 90' increments to store data to the buffer 94' is directly correlated to the network connect rate. Whereas the rate at which the decoder empty pointer 92' increments to extract data from the buffer 94' is directly correlated to the rate at which the D/A converter 16 converts the data from the buffer 94'.

As the decoder fill pointer 90' increments the input data to the buffer 94', the decoder empty pointer 92' also increments to extract data from the buffer 94' at nearly the same rate. This allows the decoder fill pointer 90' and the decoder empty pointer 92' to drift in location with respect to one another. As the decoder pointers 90' and 92' approach each other, an overflow condition can occur. This means that the decoder fill pointer 90' incrementing data faster than the decoder empty pointer 92' and thus, data is being added to the buffer 94' faster than it is being extracted. Since the empty software routine in the decoding DSP software 91b is monitoring the distance 98' between the pointers 90' and 92', it will send a signal 78' to the divider 66' to increase the divide ratio, which will have the effect of slowing down the master clock signal 36', which decreases the converting rate of the D/A converter 16. As this happens, the decoder pointers 90' and 92' will begin to separate. Once a nominal separation 98' exists between the pointers 90' and 92', the compensation signal 78' is removed.

If the decoder pointers 90' and 92' separate too much from each other, an underflow condition can occur. This means that the decoder empty pointer 92' is incrementing faster than the decoder fill pointer 90' and thus, data is being removed faster from the buffer 94' than it is being added. Since the software empty routine is monitoring the distance 98'' between the pointers 90' and 92', it will send a compensation signal 78' to divider 66' to decrease the divide ratio, which will speed up the master clock signal 36' and increase the converting rate of the D/A converter 16. As this happens, the decoding pointers 90' and 92' will begin to come together. Once a nominal separation 98' exists between the pointers 90' and 92', the compensation is again removed.

Figure 5:
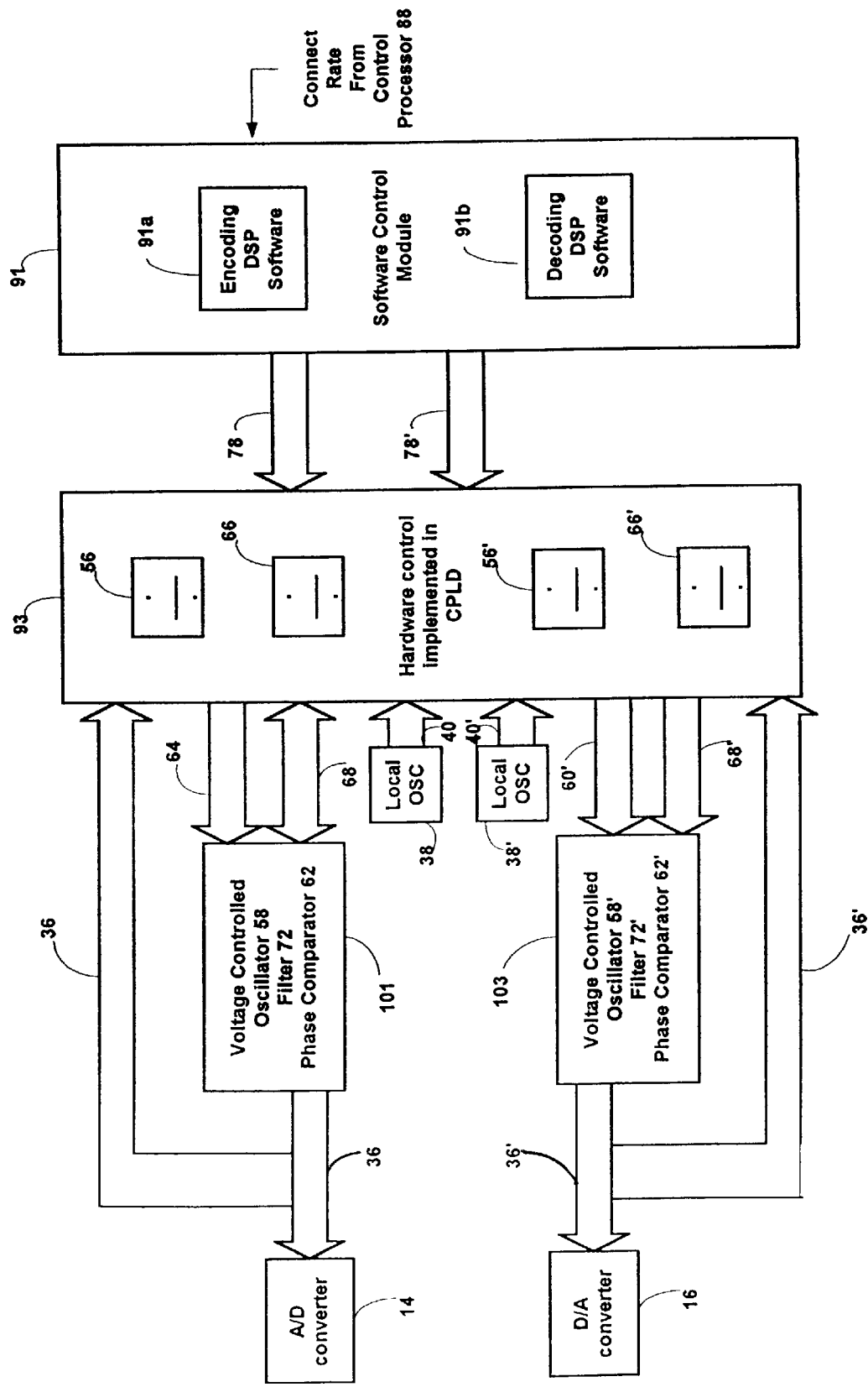
FIG. 5 is a conceptual block diagram depicting an exemplary hardware configuration along with an exemplary software control module for the illustrative CODEC of FIG. 1.

FIG. 5 depicts an illustrative implementation of the CODEC 10, including an illustrative hardware module 93 and an illustrative software control module 91. The hardware module 93 is illustratively implemented in a complex programmable logic device (CPLD), such as a CY37256VP160 manufactured by Cypress Semiconductor of San Jose, Calif. The CPLD 93 includes the dividers 56, 66, 56' and 66'. For illustrative purposes the VCO 58, filter 72 and the phase comparator 62 of the encoding PLL circuit 50 are shown conceptually grouped in the box 101.

Similarly, the VCO 58', the filter 72' and the phase comparator 62' of the decoding PLL circuit 50' are shown conceptually grouped in the block 103.

As previously discussed with respect to FIG. 3 and as shown in FIG. 5, the local oscillator 38 provides the timing signal 40 to the divider 56, by way of the CPLD 93. In turn, the divider 56 provides the phase control reference signal 60 to the phase comparator 62. Additionally, the VCO 58 couples the master clock signal 36 back to the divider 66, and the divider 66 couples the compensated feedback clock signal 68 to the phase comparator 62.

With respect to the decoding section 51', the local oscillator 38' provides the timing signal 40' to the divider 56', by way of the CPLD 93. In turn, the divider 56' provides the phase control reference signal 60' to the phase comparator 62'. Additionally, the VCO 58' couples the master clock signal 36' back to the divider 66', and the divider 66' couples the compensated feedback clock signal 68' to the phase comparator 62'.

The software control module 91 is conceptually actually two control modules: the encoding DSP software control module 91a, executing on and for controlling the encoding DSP 52, and the decoding DSP software module 91b, executing on and for controlling the decoding DSP 52'. The encoding DSP software control module 91a will be discussed first, and then the decoding DSP software control module 91b will be discussed, both with reference to FIG. 3 and FIG. 4.

The encoding DSP software control module 91a has four main functions. One, it creates the encoder buffer 94 in the encoding DSP 52 and initializes the encoder fill pointer 90 and the encoder empty pointer 92 as discussed in FIG. 4. Two, it monitors and controls the flow of data to and from the encoder buffer 94, through the use of the encoder fill pointer 90 and the encoder empty pointer 92. Third, it monitors the distance 98 between the encoder fill pointer 90 and the encoder empty pointer 92. And fourth, in the event that the distance 98 between the encoder pointers 90 and 92 is not acceptable, it sends a control signal 78 to the hardware module 93 to adjust the frequency of the master clock signal 36.

The buffer 94 is created in the encoding DSP 52 by the encoding DSP software control module 91a. The encoding pointers 90 and 92 are initialized as well. The encoding pointers 90 and 92 are initialized so that they are ½ M 105 locations away from each other. Since the buffer 94 can be considered a circular loop, this is the maximum distance the encoding pointers 90 and 92 can be initialized from each other. Once the buffer 94 is created, and the encoding pointers 90 and 92 are initialized, the encoding DSP software control module 91a is prepared to control and monitor the data from the A/D converter 14.

The encoding DSP software control module 91a monitors the data being inputted to the buffer 94 at a location pointed to by the encoder fill pointer 90. As data is being inputted into the buffer 94, the encoding DSP software control module 91a increments the encoder fill pointer 90. As data is being extracted from the buffer 94, the encoding DSP software control module 91a increments the encoder empty pointer 92. It then checks the distance 98 between the encoder fill pointer 90 and the encoder empty pointer 92. If the distance 98 between the encoder pointers 90 and 92 is acceptable, the encoding DSP software control module 91a returns to monitoring the next sample to be added to or removed from the buffer 94. If the separation 98 between the encoder fill pointer 90 and the encoder empty pointer 92 is unacceptable, the encoding DSP software control module 91a responds by sending a command over the control line 78 to the hardware control module 93. For example, if the encoder pointers 90 and 92 are too close together, indicating a possible overflow condition, the encoding DSP software control module 91a sends a command to the hardware control module 93 to decrease the sampling rate of the A/D converter 14.

The decoding DSP software control module 91b also has four main functions. One, it creates the decoder buffer 94' in the decoding DSP 52' and initializes the decoder fill pointer 90' and the decoder empty pointer 92' as discussed in FIG. 4. Two, it monitors and controls the flow of data to and from the decoder buffer 94', through the use of the fill pointer 90' and the empty pointer 92'. Third, it monitors the distance 98' between the fill pointer 90' and the empty pointer 92'. And fourth, in the event that the distance 98' between the pointers 90' and 92' is not acceptable, it sends a control signal 78' to the hardware module 93.

The buffer 94' is created in the decoding DSP 52' by the decoding DSP software control module 91b. The decoding pointers 90' and 92' are initialized as well. The decoding pointers 90' and 92' are initialized so that they are ½ M 105 locations away from each other. Since the buffer 94' can be considered a circular loop, this is the maximum distance the decoding pointers 90' and 92' can be initialized from each other. Once the buffer 94' is created, and the pointers 90' and 92' are initialized, the decoding DSP software control module 91b is prepared to control and monitor the data from the network 26.

The decoding DSP software control module 91b monitors the data being inputted to the buffer 94' at locations pointed to by the fill pointer 90'. As data is being inputted into the buffer 94', the decoding DSP software control module 91b increments the decoder fill pointer 90'. As data is being extracted from the buffer 94', the decoding DSP software control module 91b increments the decoder empty pointer 92'. It then checks the separation 98' between the decoder fill pointer 90' and the decoder empty pointer 92'. If the distance 98' between the decoder pointers 90' and 92' is acceptable, the decoding DSP software control module 91b returns to monitoring the next sample to be added to or removed from the buffer 94'. If the separation 98' between the decoder fill pointer 90' and the decoder empty pointer 92' is unacceptable, the decoding DSP software control module 91b responds by sending a compensation signal over the control line 78' to the hardware control module 93. For example, if decoder pointers 90' and 92' are too close together, indicating a possible overflow condition, the decoding DSP software control module 91b sends a command to the hardware control module 93 to decrease the converting rate of the D/A converter 16.

Figure 6A:
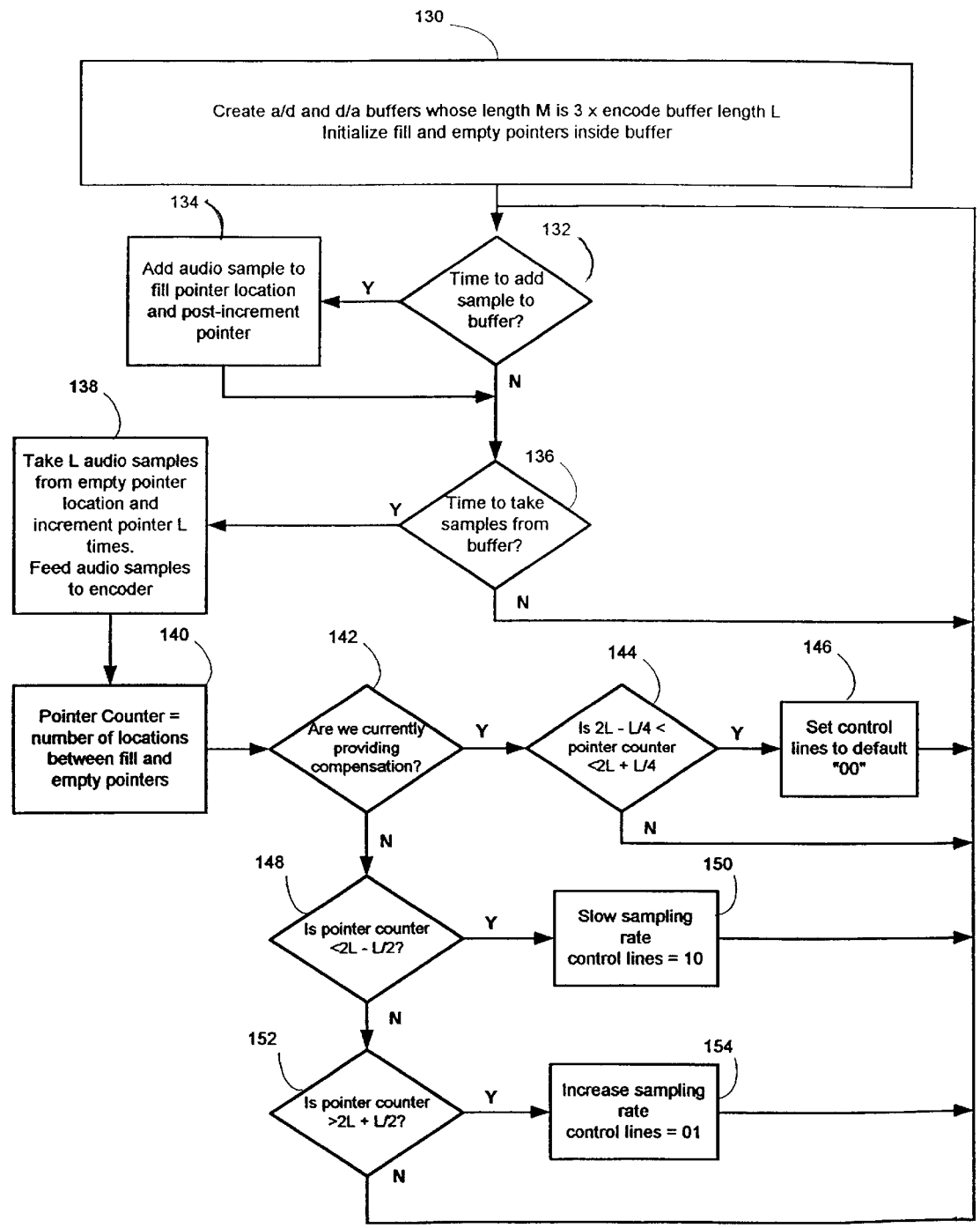
FIG. 6A is a flow diagram illustrating operation of the exemplary encoding DSP software module depicted in FIG. 5.
Figure 6B:
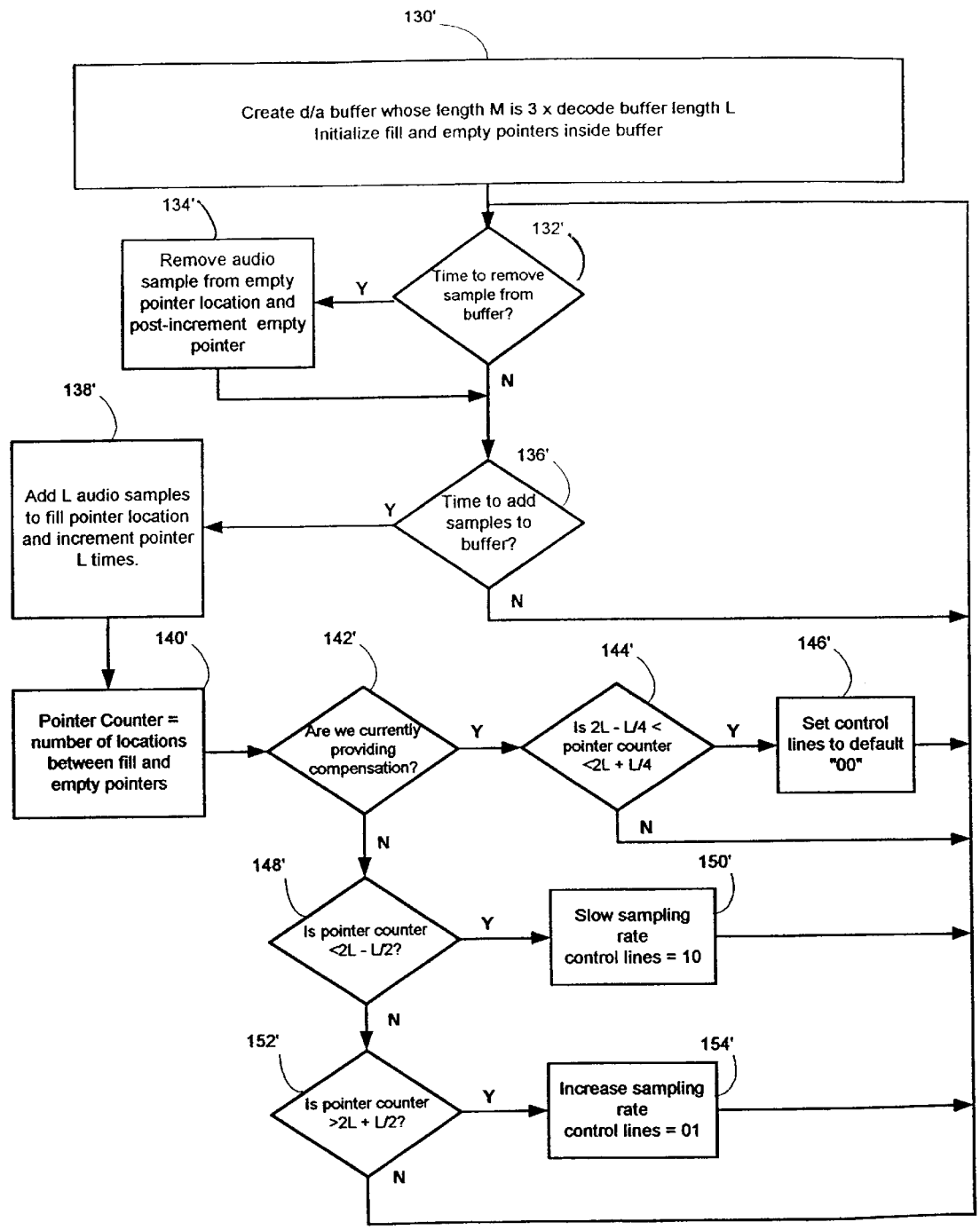
FIG. 6B is a flow diagram illustrating operation of the exemplary decoding DSP software module depicted in FIG. 5.

FIGS. 6A and 6B depict flow charts describing operation of the illustrative encoding DSP software 91a and decoding DSP software 91b of FIG. 5, respectively. More specifically, FIG. 6A depicts a flowchart of an illustrative embodiment of the software included in the encoding DSP software 91a for determining whether compensation to the encoding master clock signal 36 of FIG. 3 is required to prevent overflow or underflow of the data from the buffer 94 of FIG. 4A. Alternatively, FIG. 6B depicts a flowchart of an illustrative embodiment of the software included in the decoding DSP software 91a for determining whether compensation to the decoding master clock signal 36' of FIG. 3 is required to prevent overflow or underflow of the data from the buffer 94' of FIG. 4B.

With reference to FIG. 6A, FIG. 3, and FIG. 4A, at step 130 the encoding buffer 94 is created with length M 105, which is three times the encoder buffer length L 96. The encoder fill pointer 90 and the encoder empty pointer 92 corresponding to the encoding buffer 94 are also initialized. At this point, the encoding buffer 94 is ready to accept data samples. As the modem 59 connects to the network 26 to transmit data, the A/D converter 14 is ready to begin filling the buffer 94 with data samples. The rate at which the A/D converter 14 is sampling analog signals, corresponds to the phase control reference clock signal 60 derived from the local oscillator 38. At step 132, the determination as to whether to write a sample to the encoding buffer 94 from the A/D converter 14 is made. If a sample is written to the encoding buffer 94, the sample is added to the encoding buffer 94 at the fill pointer 90 location and the fill pointer 90 is then incremented in step 134. This loop continues as samples are added by the A/D converter 14. The rate at which the samples are added to the encoding buffer 94 is related to the sampling rate of the A/D converter 14 which is related to the phase control reference clock signal 60. Next, the encoding DSP software 91a executing on the encoder DSP 52, requests data from the encoding buffer 94 at a rate based on the modem 59 connect rate. However, the rate at which audio samples are being removed from the encoding buffer 94, is not necessarily the same as the modem connect rate. The relationship between the rate at which samples are removed from the encoding buffer 94 and the connect rate of the network is dependent on the compression ratio of the data samples. As an example, using a compression ratio of 4:1, if the network 26 transmits 16K B/S, the encoding DSP software removes 64K B/S, which the encoding DSP 52 then compresses to 16K B/S. At step 136, the determination as to whether to take digital data samples from the encoding buffer 94 is made. If samples are to be taken from the encoding buffer 94, a group of L 96 audio samples are taken from the empty pointer 92 location, and the empty pointer 92 is incremented L times as shown in step 138. That group of L 96 samples are fed to the encoder DSP 52 to be compressed. Next, in step 140, the number of sample locations between the encoding fill pointer 90 and the encoding empty pointer 92 is determined. This separation between the encoding pointers 90 and 92 is referred to as the encoding pointer counter 98. The encoding pointer counter 98 is defined as the number of sample locations between the encoding fill pointer 90 and the encoding empty pointer 92. In general, single audio samples are added to the buffer at regular intervals, while groups of audio samples L 96 are removed. This can affect the pointer counter 98. Step 140 is a logical place to determine encoding pointer counter 98 since a group of samples L 96 has been removed at step 138.

At step 142, a determination is made as to whether or not compensation is currently being provided to the master clock signal 36. If compensation is being provided, next the encoding DSP 52 checks whether encoding pointer counter 98 is between 2L−L/4 and 2L+L/4, where L 96 is the number of samples (step 144). The encoding pointers 90 and 92 should be close to the their nominal separation before compensation from control signal 78 is removed. If the encoding pointer counter 98 is between 2L−L/4 and 2L+L/4, then the control lines 78 are set to the default binary level 00 (step 146), corresponding to no compensation. If pointer counter 98 is not between those values, the routine returns to step 132.

Returning to step 142, if compensation is not currently being provided, to the divider 66 then the software 91a determines whether the encoding pointer counter 98 is less than 2L−L/2 at step 148. If pointer counter 98 is less than 2L−L/2, the software 91a retards the setting of the sampling rate, the control signal 78 to binary level 10 at step 150. If encoding pointer counter 98 is greater than 2L−L/2, then the software 91a determines whether the encoding pointer counter 98 is greater than 2L+L/2 at step 152. If pointer counter 98 is greater than 2L+L/2, the software 91a increases the setting of the sampling rate, the control signal 78 to binary level 01 at step 154. If the encoding pointer counter 98 is not greater than 2L+L/2, then the process returns to step 132. Once control lines 78 are set, they will remain in that set state until the software 91a changes the state. If compensation is not required, the software 91a does not change the control signal 78 from its default value, and provides a signal to the hardware control module 93 indicating that no compensation is required.

With reference to FIG. 6B, FIG. 3, and FIG. 4B, at step 130' the decoding buffer 94' is created with length M 105', which is three times the decoder buffer length L 96'. The decoder fill pointer 90' and the decoder empty pointer 92' corresponding to the decoding buffer 94' are also initialized. At this point, the decoding buffer 94' is ready to accept data samples. As the modem 59 connects to the network 26 to receive data, the D/A converter 16 is ready to begin removing data samples from the buffer 94'. The rate at which the D/A converter 16 is converting digital signals, corresponds to the phase control reference clock signal 60' derived from the local oscillator 38'. At step 132', the determination as to whether to remove a sample from the decoding buffer 94' by the D/A converter 16 is made. If a sample is removed from the decoding buffer 94', the sample is removed from the decoding buffer 94' at the empty pointer 92' location and the empty pointer 92' is then incremented in step 134'. This loop continues as samples are removed by the D/A converter 16. The rate at which the samples are removed by the decoding buffer 94' is related to the conversion rate of the D/A converter 16 which is related to the phase control reference clock signal 60'. Next, the decoding DSP software 91b executing on the decoder DSP 52', writes a group of data samples to the decoding buffer 94' at a rate based on the modem 59 connect rate. However, the rate at which audio samples are being added to the decoding buffer 94', is not necessarily the same as the modem connect rate. The relationship between the rate at which samples are added to the decoding buffer 94' and the connect rate of the network is dependent on the compression ratio of the data samples. As an example, using a compression ratio of 4:1, if the network 26 receives 16K B/S, the decoding DSP 52' then uncompresses the data to 64K B/S. At step 136', the determination as to whether to add digital data samples to the encoding buffer 94' is made. If samples are to be added to the decoding buffer 94', a group of L 96' audio samples are added to the fill pointer 90' location, and the fill pointer 90' is incremented L times as shown in step 138'. That group of L 96' samples is fed to the D/A converter to be converted to analog signals. Next, in step 140', the number of sample locations between the decoding fill pointer 90' and the decoding empty pointer 92' is determined. This separation between the decoding pointers 90' and 92' is referred to as the decoding pointer counter 98'. The decoding pointer counter 98' is defined as the number of sample locations between the decoding fill pointer 90' and the decoding empty pointer 92'. In general, single audio samples are removed from the buffer at regular intervals, while groups of audio samples L 96' are added. This can affect the decoding pointer counter 98'. Step 140' is a logical place to determine decoding pointer counter 98' since a group of samples L 96' has been added at step 138'.

At step 142', a determination is made as to whether or not compensation is currently being provided to the master clock signal 36'. If compensation is being provided, next the decoding DSP 52' checks whether the decoding pointer counter 98' is between 2L−L/4 and 2L+L/4, where L 96' is the number of samples (step 144'). The decoding pointers 90' and 92' should be close to the their nominal separation before compensation from control signal 78' is removed. If the decoding pointer counter 98' is between 2L−L/4 and 2L+L/4, then the control lines 78' are set to the default binary level 00 (step 146'), corresponding to no compensation. If pointer counter 98' is not between those values, the routine returns to step 132'.

Returning to step 142', if compensation is not currently being provided to the divider 66', then the software 91*b* determines whether the decoding pointer counter 98' is less than 2L−L/2 at step 148'. If decoding pointer counter 98' is less than 2L−L/2, the software 91*b* retards the setting of the conversion rate, the control signal 78 to binary level 10 at step 150'. If decoding pointer counter 98' is greater than 2L−L/2, then the software 91*b* determines whether the decoding pointer counter 98' is greater than 2L+L/2 at step 152'. If pointer counter 98' is greater than 2L+L/2, the software 91*b* increases the setting of the conversion rate, the control signal 78' to binary level 01 at step 154'. If the decoding pointer counter 98' is not greater than 2L+L/2, then the process returns to step 132'. Once control lines 78' are set, they will remain in that set state until the software 91*b* changes the state. If compensation is not required, the software 91*b* does not change the control signal 78' from its default value, and provides a signal to the hardware control module 93 indicating that no compensation is required.

Figure 7:
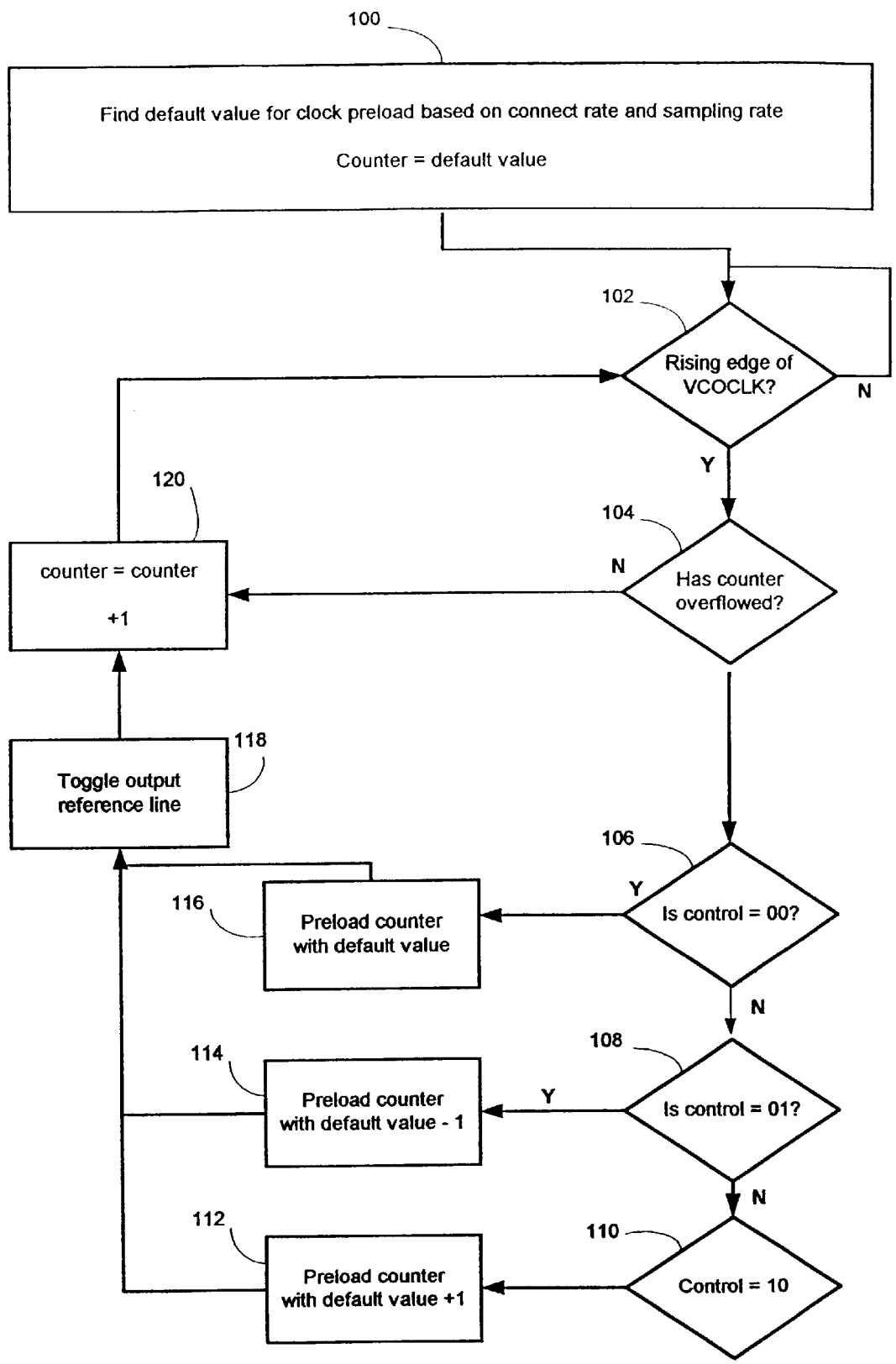
FIG. 7 is a flow diagram illustrating operation of the exemplary hardware configuration depicted in FIG. 5.

FIG. 7 depicts a flow chart illustrating an exemplary process for adjusting the dividers 56, 66, 56' and 66' included in the hardware control module 93 of FIG. 5. The dividers 56, 66, 56' and 66' provide the necessary compensation for generating the encoding master clock signal 36, and the decoding master clock signal 36'. The process is substantially the same for generating the encoding master clock signal 36 as it is for the decoding master clock signal 36'. Therefore, only generation of the encoding master clock signal 36' is described below.

In step 100, initialization parameters relating to the performance requirements of the CODEC 10 are input to the control processor 88 by the user by way of the keypad 86. In the case of an audio application, these parameters include, for example, the frequency range or quality of the audio required by the application. Step 100 also determines the default divide ratio value of the dividers 56 and 56' after the modem 59 connects with the network 26. Based on the user input information, the encoding DSP 52 preloads a default value for the divide counter and applies the divide counter to the divider 66 by way of the control signal 78. Thus, changing the divide counter changes the divide ratio of the divider 66.

Next, in step 102, the rising edge of the encoder master clock signal 36 is monitored in the feedback loop of the master clock generator 34 of FIG. 2. In other embodiments, any observed event, such as the falling edge of the encoding master clock signal 36 can be used. Once a clock edge is detected, a determination (step 104) is made as to whether the divide counter has overflowed. In one embodiment, a 4-bit divide counter can be used for counting between zero and fifteen. In another embodiment, a 12-bit divide counter is used for counting between zero and 4095. If the divide counter has not overflowed (has not returned to zero), the divide counter is incremented by one (step 120), and the process returns to step 102. If the divide counter has overflowed (returned to zero), the control signal 78 is checked to detect if it is at the default binary level 00 (step 106) as determined in the software module 91*a*.

If the control signal 78 is at the default binary value of 00, as determined by the software module 91*a*, then the encoding DSP 52 preloads the divide counter with the default value (step 116). This sets the divide ratio for the divider 66, and is an indication that no compensation is being provided to the encoder master clock signal 36.

If the control line 78 is set at binary level 01 (step 108), as determined by the software module 74, the encoding DSP 52 preloads the divide counter with the default value minus one (step 114). This causes a change to the default divide ratio of the divider 66 and causes an increase in the sampling rate of the A/D converter 14.

If the control signal 78 is at binary level 10 (step 112), as determined by the software module 74, the encoding DSP 52 preloads the divide counter with the default value plus one (step 112). This causes a change to the default divide ratio of the divider 66 and causes a decrease in the sampling rate of the A/D converter 14.

Next, in step 118, the VCO 58 provides the master clock signal 36 out of the master clock generator 34 and as a feedback signal to the divider 66. In step 120, the encoding DSP 52 increments the divide counter by one. The process of FIG. 7 then repeats itself.

Having described and shown the preferred embodiments of the invention, it will now become apparent to one of skill in the art that other embodiments incorporating the concepts may be used and that many variations are possible which will still be within the scope and spirit of the claimed invention. It is felt, therefore, that these embodiments should not be limited to disclosed embodiments but rather should be limited only by the spirit and scope of the following claims.

What is claimed is:

1. A method for converting an analog signal to a digital signal for transmission over a communication network, said method comprising, communicatively connecting to said communication network through a network interface, wherein said network interface is one of a modem or a digital network access device, detecting a connect rate between said network interface and said communication network, providing a local oscillator operating independently of said communication network, generating an encoding master clock signal from said local oscillator, wherein said encoding master clock signal operates at a substantially stable frequency that depends at least in part on said connect rate, receiving an analog signal, converting said analog signal into digital samples using an analog-to-digital converter operating at a selected sampling rate, wherein said selected sampling rate is related to said frequency of said encoding master clock signal, transferring said digital samples from said analog-to-digital converter to said network interface for output onto said communication network, and when transferring said digital samples from said analog-to-digital converter to said network interface, intermediately storing said digital samples in an encoding buffer having a plurality of locations, maintaining a defined time relationship between each of said digital samples while said digital samples are being transferred between said analog-digital-converter and said network interface, providing a fill pointer associated with said encoding buffer, wherein said fill pointer points to one of the locations in said encoding buffer and indicates to which of the locations an incoming one of said digital samples is to be stored, incrementing said fill pointer to point to a next fill one of said locations subsequent to storing one of said digital samples in said encoding buffer, resetting said fill pointer to point to a first location in said encoding buffer in response to storing one of said digital samples in a last location of said encoding buffer, providing an empty pointer associated with said encoding buffer, wherein said empty pointer points to one of the locations in said encoding buffer storing one of said digital samples to be transferred to said network interface for output, incrementing said empty pointer to point to a next transfer one of the locations containing a next one of said digital samples to be transferred to said network interface, and resetting said empty pointer to point to said first location in said encoding buffer in response to transferring one of said digital samples from said last location of said encoding buffer to said network interface.

2. A method according to claim 1 further comprising, monitoring a distance between said fill pointer and said empty pointer, wherein said distance is measured in relation to a number of locations between a location pointed to by said fill pointer and a location pointed to by said empty pointer.

3. A method according to claim 2 further comprising, decreasing said selected sampling rate in response to said distance becoming less than a predefined closeness threshold.

4. A method according to claim 2 further comprising, increasing said selected sampling rate in response to said distance becoming greater than a predefined separation threshold.

5. A method according to claim 2 further comprising, decreasing said frequency of said encoding master clock signal in response to said distance becoming less than a predefined closeness threshold.

6. A method according to claim 5 further comprising, decreasing said sampling rate in dependence on said decreasing of said frequency of said encoding master clock.

7. A method according to claim 2 further comprising, increasing said frequency of said encoding master clock signal in response to said distance becoming greater than a predefined separation threshold.

8. A method according to claim 7 further comprising, increasing said sampling rate in dependence on said increasing of frequency of said encoding master clock signal.

9. A method according to claim 1, wherein said generating of said encoding master clock signal further comprises, frequency dividing a clock signal from said local oscillator to obtain a phase comparator reference signal, determining an initial divide ratio for performing said frequency dividing based at least in part on said connect rate, and phase locking said comparator reference signal to provide said encoding master clock signal at a substantially constant initial frequency.

10. A method according to claim 2, wherein generating a master clock signal further comprises, frequency dividing a clock signal from said local oscillator to obtain a phase comparator reference signal, determining an initial divide ratio for performing said frequency dividing based at least in part on said connect rate, and phase locking said comparator reference signal to provide said encoding master clock signal at said substantially stable frequency.

11. A method according to claim 10 further comprising, adjusting said substantially stable frequency in dependence on said distance between said fill pointer and said empty pointer.

12. A method for converting digital samples received over a communication network to an analog signal, said method comprising, communicatively connecting to said communication network through a network interface, wherein said network interface is one of a modem and a digital network access device, detecting a connect rate between said network interface and said communication network, providing a local oscillator operating independently of said communication network, generating a decoding master clock signal from said local oscillator, wherein said decoding master clock signal operates at a substantially stable frequency that depends at least in part on said connect rate, receiving digital samples from said communication network by way of said network interface, operating a digital-to-analog converter at a selected conversion rate, wherein said selected conversion rate is related to said substantially stable frequency of said encoding master clock signal, transferring said digital samples from said network interface to said digital-to-analog converter, and when transferring said digital samples from said network interface to said digital-to-analog converter, intermediately storing said digital samples in a decoding buffer having a plurality of locations, converting said digital samples to an analog signal at said digital-to-analog converter, maintaining a defined time relationship between each of said digital samples while said digital samples are being transferred between said network interface and said digital-to-analog converter, providing a fill pointer associated with said decoding buffer, wherein said fill pointer points to one of the locations in said decoding buffer and indicates to which of the locations an incoming one of said digital samples is to be stored, incrementing said fill pointer to point to next fill one of said locations subsequent to storing one of said digital samples in said decoding buffer, resetting said fill pointer to point to a first location in said buffer in response to storing one of said digital samples in a last location of said decoding buffer, providing an empty pointer associated with said decoding buffer, wherein said empty pointer points to one of the locations in said decoding buffer storing one of said digital samples to be transferred to said digital-to-analog converter for conversion, incrementing said empty pointer to point to a next transfer one of the locations containing a next one of said digital samples to be transferred to said digital-to-analog converter, and resetting said empty pointer to point to said first location in said decoding buffer in response to transferring one of said digital samples from said last location of said buffer to said digital-to-analog converter.

13. A method according to claim 12 further comprising, monitoring a distance between said fill pointer and said empty pointer, wherein said distance is measured in relation to a number of locations between a location pointed to by said fill pointer and a location pointed to by said empty pointer.

14. A method according to claim 13 further comprising, increasing said selected conversion rate in response to said distance becoming less than a predefined closeness threshold.

15. A method according to claim 13 further comprising, decreasing said selected conversion rate in response to said distance becoming greater than a predefined separation threshold.

16. A method according to claim 13 further comprising, increasing said frequency of said decoding master clock signal in response to said distance becoming less than a predefined closeness threshold.

17. A method according to claim 16 further comprising, increasing said selected conversion rate in dependence on said increasing of said frequency of said decoding master clock.

18. A method according to claim 13 further comprising, decreasing said frequency of said decoding master clock signal in response to said distance becoming greater than a predefined separation threshold.

19. A method according to claim 18 further comprising, decreasing said selected conversion rate in dependence on said decreasing of said frequency of said decoding master clock signal.

20. A method according to claim 12, wherein said generating of said decoding master clock signal further comprises, frequency dividing a clock signal from said local oscillator to obtain a phase comparator reference signal, determining an initial divide ratio for performing said frequency dividing based at least in part on said connect rate, and phase locking said comparator reference signal to provide said decoding master clock signal at said substantially constant frequency.

21. A method according to claim 13, wherein generating a master clock signal further comprises, frequency dividing a clock signal from said local oscillator to obtain a phase comparator reference signal, determining an initial divide ratio for performing said frequency dividing based at least in part on said connect rate, and phase locking said comparator reference signal to provide said decoding master clock signal at said substantially constant frequency.

22. A method according to claim 21 further comprising, adjusting said frequency in dependence on said distance between said fill pointer and said empty pointer.

23. The method of claim 1 further comprising adjusting said frequency of said master clock to maintain said defined time relationship.

24. The method of claim 1 further comprising adjusting said sampling rate of said analog-to-digital converter to maintain said defined time relationship.

25. The method of claim 12 further comprising adjusting said frequency of said master clock to maintain said defined time relationship.

26. The method of claim 12 further comprising adjusting said sampling rate of said digital-to-analog converter to maintain said defined time relationship.

* * * * *